United States Patent
Irsigler et al.

(10) Patent No.: US 7,638,869 B2
(45) Date of Patent: Dec. 29, 2009

(54) SEMICONDUCTOR DEVICE

(75) Inventors: Roland Irsigler, Munich (DE); Steve Wood, Munich (DE); Hermann Ruckerbauer, Moos (DE); Richard Johannes Luyken, Munich (DE); Carsten Niepelt, Dietramszell (DE)

(73) Assignee: Qimonda AG, Munich (DE)

( * ) Notice: Subject to any disclaimer, the term of this patent is extended or adjusted under 35 U.S.C. 154(b) by 173 days.

(21) Appl. No.: 11/692,637

(22) Filed: Mar. 28, 2007

(65) Prior Publication Data

US 2008/0237891 A1 Oct. 2, 2008

(51) Int. Cl.
*H01L 23/48* (2006.01)
(52) U.S. Cl. ............... 257/686; 257/774; 257/E23.011
(58) Field of Classification Search ............ 257/774, 257/777, 686, E23.011, E25.013
See application file for complete search history.

(56) References Cited

U.S. PATENT DOCUMENTS 6,400,008 B1 * 6/2002 Farnworth .................. 257/698
7,224,070 B2 * 5/2007 Yang ......................... 257/777

* cited by examiner

*Primary Examiner*—Roy K Potter
(74) *Attorney, Agent, or Firm*—Dicke, Billig & Czaja, PLLC

(57) ABSTRACT

A semiconductor device having a stacked arrangement of a substrate and a first chip and a second chip is disclosed. In one embodiment, the first chip is arranged with a lower face on an upper face of the substrate; the second chip with a lower face on an upper face of the first chip, whereby a partial area of the upper face of the first chip that is adjacent to an edge of the first chip is uncovered by the second chip; a fifth wire contact pad is arranged on the uncovered area of the upper face of the first chip; a first bonding wire is arranged that is connected with a first wire contact pad of the substrate and the fifth wire contact pad of the first chip.

10 Claims, 6 Drawing Sheets

SEMICONDUCTOR DEVICE

BACKGROUND

The present invention refers to a semiconductor device having an arrangement of a substrate with a first and a second chip.

Market demand for smaller, lighter, and more powerful electronic devices drives the development of more compact packages and increased functionality. Demand for electronic devices, such as cellular telephones, personal digital assistants, and portable computing devices, contributes heavily to the overall market demand. Development of more compact packages and increased functionality has led to packaging technologies such as fine pitch ball grid arrays (FBGA), chip scale packages (CSP), wafer level packaging (WLP), multi-chip module (MCM) technology, and stacked die packaging. An MCM includes multiple semiconductor die in one package, such as multiple stacked die in a CSP or multiple stacked die on a BGA. Increasing the functionality has led to system in package (SiP) solutions. Some SiP products use stacked die packaging technology.

Different technologies have been explored for stacking and connecting semiconductor dice in a stacked die package. Typically, stacked die are arranged in a pyramid stacked die configuration or an overhanging stacked die configuration. Wire bonding is a popular interconnection method due to existing infrastructure, flexibility, and cost advantages. In a pyramid stacked die configuration, a smaller die is placed on top of a larger die and a wire loop from the top die clears the edge of the bottom die as well as the wire loops of the bottom die. In an overhanging stacked die configuration, a larger die is placed on top of a smaller die and a spacer situated between the semiconductor dice provides space for the wire loops of the bottom die.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a semiconductor device having an arrangement of a substrate with a first chip and a second chip. The first chip is arranged with a lower face on an upper face of the substrate. The second chip is arranged with a lower face on an upper face of the first chip. A partial area of the upper face of the first chip is not covered by the second chip. A first contact pad is arranged on the uncovered area of the upper face of the first chip. A first bonding wire is arranged which is connected to a contact area of the substrate and the first contact pad of the first chip.

A further embodiment provides an arrangement of a substrate with a first chip and a second chip. The first chip is arranged with a lower face on an upper face of the substrate. The second chip is arranged with a lower face on an upper face of the first chip. A connecting layer is arranged between the first chip and the second chip. A first contact pad is arranged on an upper face of the first chip near an edge of the first chip. A first bonding wire is arranged which is connected to a contact area of the substrate and the first contact pad.

Figure 1:
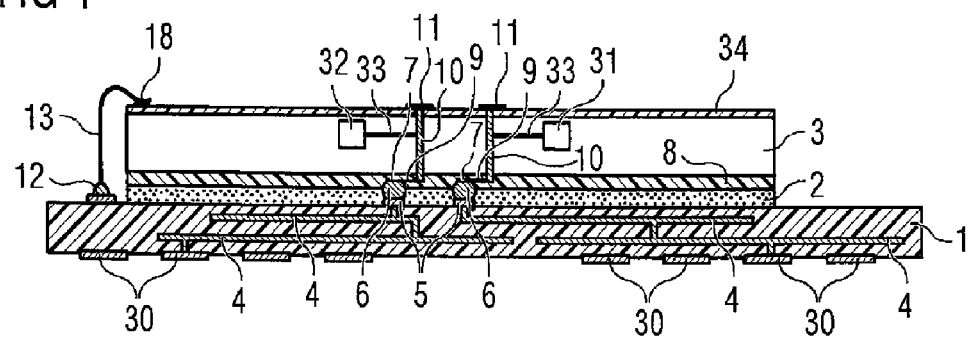
FIG. 1 illustrates a first process step with a substrate and a first chip.

FIG. 1 illustrates a cross-sectional view of a semiconductor device including a substrate 1, a fixing layer 2 and a first chip 3. The fixing layer 2 is disposed between the substrate 1 and the first chip 3. The substrate 1 includes several electrically conductive lines 4. On an upper face of the substrate 1, two first contact pads 5 are arranged. The first contact pads 5 are adjacent to the fixing layer 2. On each first contact pad 5 or a first back side contact pad 7 which is arranged on a lower side of the first chip 3, a first solder ball 6 is disposed. Each first solder ball 6 connects a first contact pad 5 to a first back side contact pad 7 that are arranged on a lower side of the first chip 3. The first solder balls 6 are embedded in the fixing layer 2 which may be made of a gluing material or of glass or silicon oxide providing mechanical fixing between the substrate 1 and the first chip 3. On the lower side dedicated to the fixing layer 2, the first chip 3 may include a connecting layer 8. In the connecting layer 8, connecting lines 9 are arranged which are guided in a lateral direction and which connect the first back side pads 7 to first via connecting elements 10. The connecting layer 8 may be made of electrically insulating material in which the connective lines 9 are embedded. The first via connecting elements 10 extend from a lower side of the first chip 3 to an upper side of the first chip 3. An upper end of the via connecting elements 10 is electrically connected to first front side pads 11. The first front side pads 11 are arranged on an upper face of the first chip 3. The substrate 1 includes a first wire contact pad 12 that is arranged beside the first chip 3 on an upper face of the substrate 1. The first wire contact pad 12 is connected to a first end of a first bonding wire 13 that is connected with a second end to a fifth wire contact pad 18. The fifth wire contact pad 18 is disposed on an upper face of the first chip 3 near an edge of the upper face adjacent to the first wire contact pad 12.

The via connecting elements 10 may be electrically insulated from the first chip 3. The first chip 3 may comprise electrical circuits 32 and/or electrical devices 31 that are integrated on the first chip 3. The electrical circuits 32 and the electrical devices 31 may be electrically connected by second lines 33 to the first via connecting elements 10 and/or to the fifth wire contact pad 18 and/or to the first front side pads 11 and/or to the first back side pads 7. The first bonding wire 13 may be used for delivering source voltage to the first chip 3. The first via connecting elements 10 may be used for delivering or exchanging data signals between the substrate 1 and the first chip 3. The substrate 1 may comprise contact fields 30 that are arranged on a lower side of the substrate 1. The contact fields 30 may be connected with the conductive lines 4 that are in contact with the first contact pads 5. The first chip 3 may comprise a cover layer 34 that is made of electrically insulating material and covers the upper face of the first chip 3.

Figure 2:
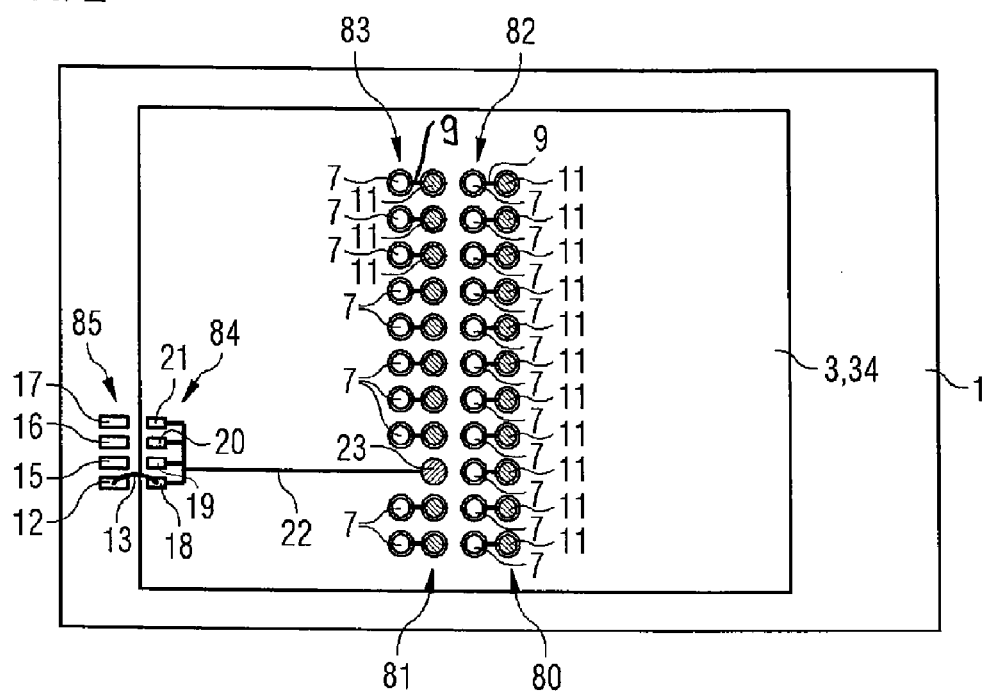
FIG. 2 illustrates a top view on the first chip of FIG. 1.

FIG. 2 illustrates a top view on the arrangement of FIG. 1. On the upper face of the substrate 1, the first, a second, a third and a fourth wire contact pad 12, 15, 16, 17 are disposed. On an upper face of the first chip 3, the fifth, a sixth, a seventh and an eighth wire contact pad 18, 19, 20, 21 are arranged. The further fifth, sixth, seventh and eighth wire contact pads 18, 19, 20, 21 are electrically connected by a first line 22 that is guided to a further contact 23. The further contact 23 is not a via connecting element but is electrically connected to electrical circuits 32 and/or electrical devices 31 and/or second electrical lines 33 that are integrated on the first chip 3.

In FIG. 2, the first back side pads 7 are schematically illustrated. The first back side pads 7 are connected by the connecting lines 9 with the first front side pads 11. In the illustrated embodiment, the front side is the upper side of the first chip 3 and the back side is the lower side of the first chip 3. The first chip 3 includes a first and a second row 80, 81 of first front side pads 11 and a third and a fourth row 82, 83 of first back side pads 7 that are arranged in parallel. In the illustrated embodiment, in the fourth row 83 only ten back side pads 7 are disposed. In the dedicated second row 81 eleven first front side pads 11 are arranged, one front side contact pad being embodied as the further contact 23. The further contact 23 is not connected with a first back side pad 7. The further contact 23 may not be connected with a first via connecting element 10. There may be no first via connecting element 10 disposed under the further contact 23. Basically, for each first back side pad 7 a first front side pad 11 is disposed that is electrically connected by a line 9 with a first via connecting element 10 and with the dedicated first front side pad 11.

The fifth, sixth, seventh and eighth wire contact pads 18, 19, 20, 21 constitute a further contact area 84. The first, second, third and fourth wire contact pad 12, 15, 16, 17 constitute a contact area 85 on the substrate 1. Providing a contact area 85 and a further contact area 84 with several wire contact pads has the advantage that a further contact area 84 may be used for different chips and depending on the position of the chips in the stacked arrangement one of the available wire contact pads 18, 19, 20, 21 of the further contact area, 84 may be used for electrically connecting by a first bonding wire 13 the respective chip with the substrate 1. In one embodiment the contact area 85 and the further contact area 84 may be shaped identical. The first bonding wire 13 may be used for delivering data signals and/or a supply voltage and/or a ground voltage of the respective chip. For example the electrical device 31 and/or the electrical circuit 32 may be supplied with data signals and/or with a supply voltage and/or with a ground voltage via the first bonding wire 13.

Figure 3:
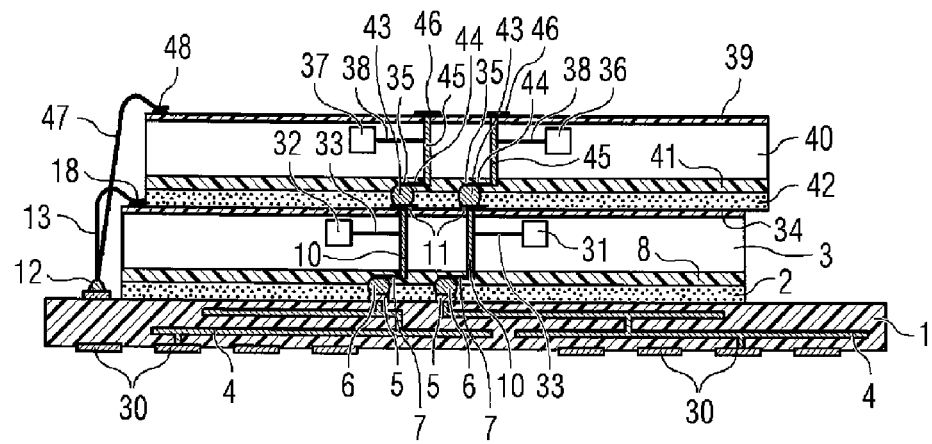
FIG. 3 illustrates a second process step with a substrate, a first chip and a second chip.

FIG. 3 illustrates a further embodiment with a substrate 1, a first chip 3 and a second chip 40 that is arranged on the first chip 3. The substrate 1 and the first chip 3 may be identical to the substrate 1 and the first chip 3 of FIG. 1. The second chip 40 may be made of a semiconductor material including a second connecting layer 41 on a lower face dedicated to the upper face of the first chip 3. The second connecting layer 41 may be made of the same material and/or have the same structure and shape as the first connecting layer 8. Between the upper face of the first chip 3 and the second connecting layer 41 of the second chip 40, a second fixing layer 42 is arranged. The second fixing layer 42 connects mechanically the second chip 40 with the first chip 3. The second fixing layer 42 may be made of the same material and/or the same structure and shape as the first fixing layer 2. Between the first front side pads 11 of the first chip 3 and the second back side pads 35, second solder balls 43 are arranged. Each second solder ball 43 is in contact with a first front side pad 11 and a second back side pad 35. Each second back side pad 35 is connected with a second connecting line 44 that are arranged in the second connecting layer 41. The second connecting lines 44 are guided in a lateral direction. The second connecting layer 41 may be made of electrically insulating material, e.g., silicon oxide or glass. The second connecting lines 44 are electrically connected to second via connecting elements 45 extending from the lower side of the second chip 40 to the upper side of the second chip 40. Each of the second via connecting elements 45 is connected with a second front side pad 46 that are arranged on an upper face of the second chip 40. Furthermore, a second bonding wire 47 is arranged which is connected to a second wire contact pad 15 of the substrate 1 and a ninth wire contact pad 48 of the second chip 40. The second chip 40 may comprise second electrical circuits 36 and/or second electrical devices 37 that may be connected with second via connecting elements 45 and/or with second back side pads 35 and/or with second front side pads 46 by third lines 38. The second chip 40 may be covered by a second cover layer 39.

Figure 4:
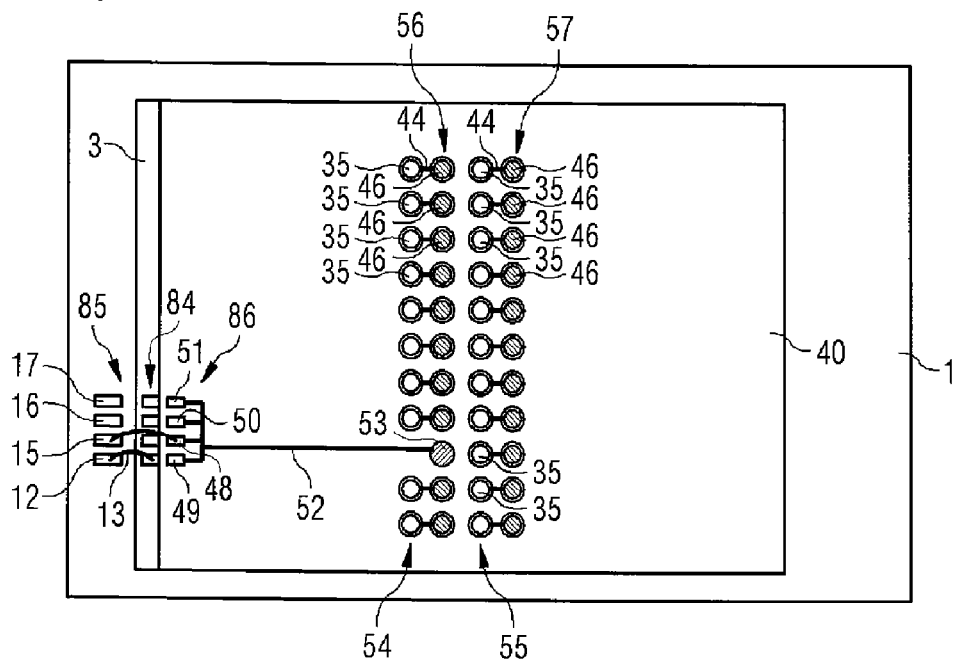
FIG. 4 illustrates a top view on the second chip, the first chip and the substrate.

FIG. 4 illustrates a top view on the arrangement of FIG. 3. On the upper face of the second chip 40, the ninth wire contact pad 48, a tenth wire contact pad 49, an eleventh wire contact pad 50 and a twelfth wire contact pad 51 are arranged as a third contact area 86 near an edge of the second chip 40. The ninth, tenth, eleventh and twelfth wire contact pads 48, 49, 50, 51 are connected with a second contact line 52. The second contact line 52 is guided to a second further contact 53. The second further contact 53 may be electrically connected to second electrical circuits 36 and/or electrical devices 37 that are integrated in the second chip 40.

The second chip 40 includes a first and a second further row 54, 55 with second back side pads 35 that are arranged on a lower face of the second chip 40 and that are in direct contact to the second solder balls 43. The second back side pads 35 of the first and the second further row 54, 55 are arranged in parallel. The second chip 40 includes furthermore a third and a fourth further row 56, 57 of second front side pads 46. The second back side pads 35 of the first and the second further row 54, 55 are electrically connected via the second connecting lines 44 with the second via connecting elements 45 and the respective second front side pads 46. The second via connecting elements 45 may be electrically connected to second electrical devices and/or second electrical circuits that are integrated in the second chip 40. The third contact area 86 may be shaped identical to the contact area 85 of the substrate 1. The arrangement of the second back side pads 35 may be identical to the arrangement of the first back side pads 7 referred to the number and the locations of the pads. The arrangement of the second front side pads 46 may be identical to the arrangement of the first front side pads 11 referred to the number and the locations of the pads. The second further contact 53 may be connected with a second via connecting element 45 and/or with a second electrical circuit 36 and/or with a second electrical device 37. The second further contact 53 may be used for providing data signals and/or a supply voltage of the second chip 40.

Figure 5:
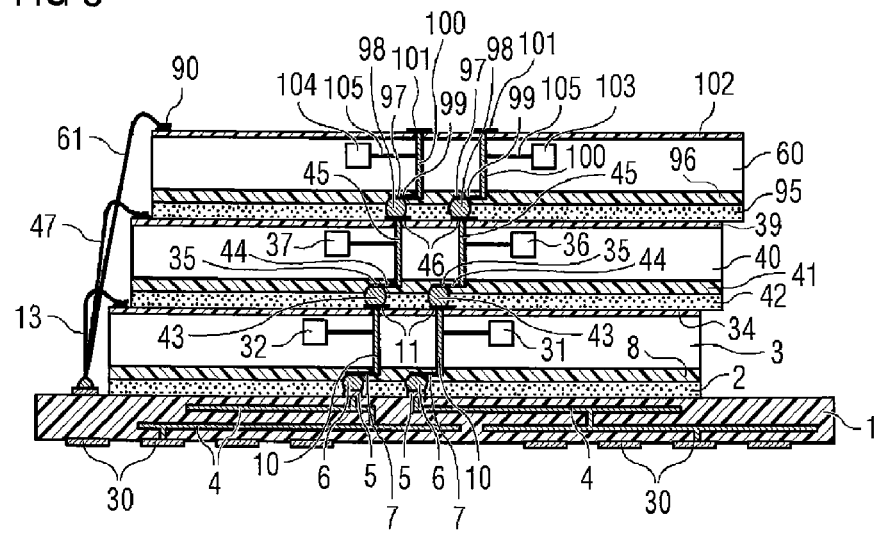
FIG. 5 illustrates a further arrangement with three stacked chips on a substrate.

FIG. 5 illustrates a further embodiment of an arrangement with the substrate 1, the first chip 3, the second chip 40 and a third chip 60. The third chip may have the same structure and/or the same shape and/or be made of the same material as the first chip 3. The third chip 60 may be identical to the second chip 40. A third bonding wire 61 is arranged which is electrically connected to the third wire contact pad 16 of the substrate 1 and a thirteen wire contact pad 90 of a third contact area 96 that is arranged on an upper side of the third chip 60. The third chip 60 is fixed and electrically connected to the second chip 40 by a third fixing layer 95. The third fixing layer may have the same structure and/or be made of the same material as the first fixing layer 2. Furthermore, a third connecting layer 96 is disposed on a lower side of the third chip 60. The third connecting layer 96 may have the same structure or may be made of the same material as the first connecting layer 8. On a lower side of the third connecting layer 96 third back side pads 97 are arranged. Third solder balls 98 are disposed between second front side pads 46 and third back side pads 97. The third back side pads 97 and the second front side pads 46 are in the direct contact to third solder balls 98. The third solder balls 98 are imbedded in the third fixing layer 95. The third back side pads 97 are connected by third lines 99 with third wire connecting elements 100. Each third wire connecting element 100 is guided from a lower side of the third chip 60 to an upper side of the third chip 60. On the upper side of the third chip 60 third front side pads 101 are disposed. The third chip 60 may comprise an electrically isolating third cover layer 102 that is arranged on the upper side of the third chip 60. The third chip 60 may comprise third electrical circuits 103 and/or third electrical devices 104. The third electrical circuits and/or the third electrical devices may be electrically connected by fourth lines 105 with the third wire connecting elements 100. The third electrical circuits 103 and the third electrical devices 104 may be electrically connected to the thirteenth wire contact pad 90. The third chip 60 may be identical to the first chip 3. However, depending on the used embodiment, third chip 60 may comprise different technical features and/or different shapes compared to the first chip 3.

Figure 6:
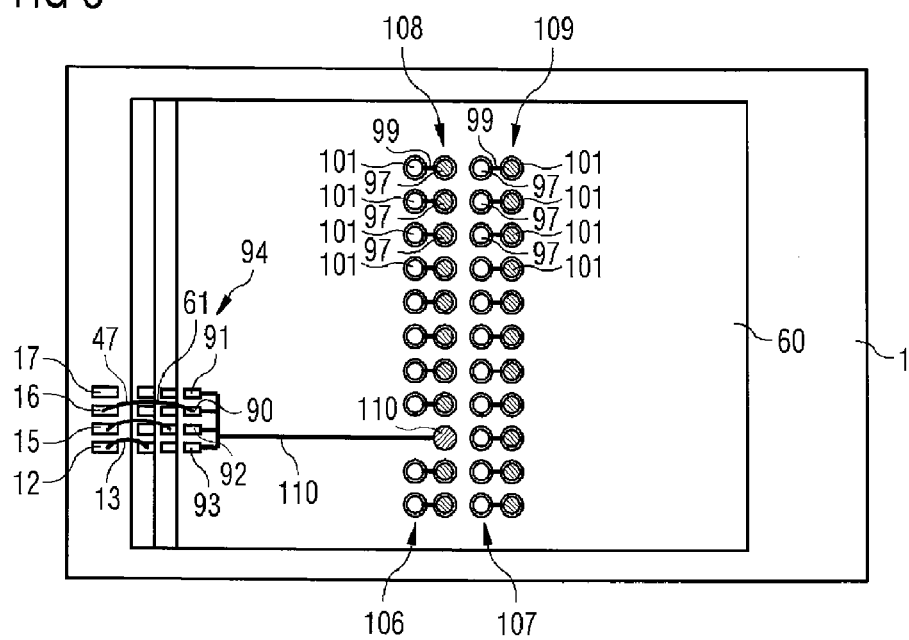
FIG. 6 illustrates a top view on the arrangement of FIG. 5.

FIG. 6 illustrates a top view on the arrangement of FIG. 5 with the substrate 1 and the three stacked chips 3, 40, 60. The third chip 60 includes a fifth row 106 of third back side pads 97 and a sixth row 107 of third back side pads 97 that are arranged in parallel and schematically illustrated in FIG. 6 although they are located on the lower side of the third chip 60. Furthermore, the third chip 60 includes a seventh row 108 of third front side pads 101 and an eighth row 109 of third front side pads 101. The third front side pads 101 of the seventh and eighth row 108, 109 are arranged in parallel. In the fifth row 106 a third back side pad 97 is missing and the dedicated front side pad is embodied as a fourth further contact 110. The fourth further contact 110 is electrically connected with the thirteenth, fourteenth, fifteenth, and sixteenth wire contact pad 90, 91, 92, 93 by a fifth line 111.

Each of the third back side pad 97 is electrically connected by a third line 99 with a respective third wire connecting element 100 and therefore with a respective third front side pad 101. The fourth further contact 110 may be electrically connected with the third electrical circuit 103 and/or the third electrical device 104. The fourth contact area 94 may have the same shape as the first contact area 85. The providing of contact areas with the same shape on the different chips has the advantage that the same process and/or the same mask may be used for forming the contact areas on the different chips. The electrical connection between the different wire contact pads of a contact area has the advantage that the electrical connection between the substrate 1 and the respective chip may be provided by a bonding wire that is connected with any of the wire contact pads and there is always an electrical connection between the substrate and the respective further contact that is electrically connected with the respective contact area. It is not necessary to provide for each chip an individual shape of contact area depending on the position of the chip in the stacked arrangement.

Depending on the used embodiment, there may also be more than three stacked chips disposed in the same manner and electrically and mechanically fixed as explained referring to the three chips of FIG. 6.

The third chip 60 includes the same number and the same design of via connecting elements and front side contact pads and back side contact pads as the first chip 3. FIG. 6 illustrates a top view of the arrangement of FIG. 5.

Figure 7:
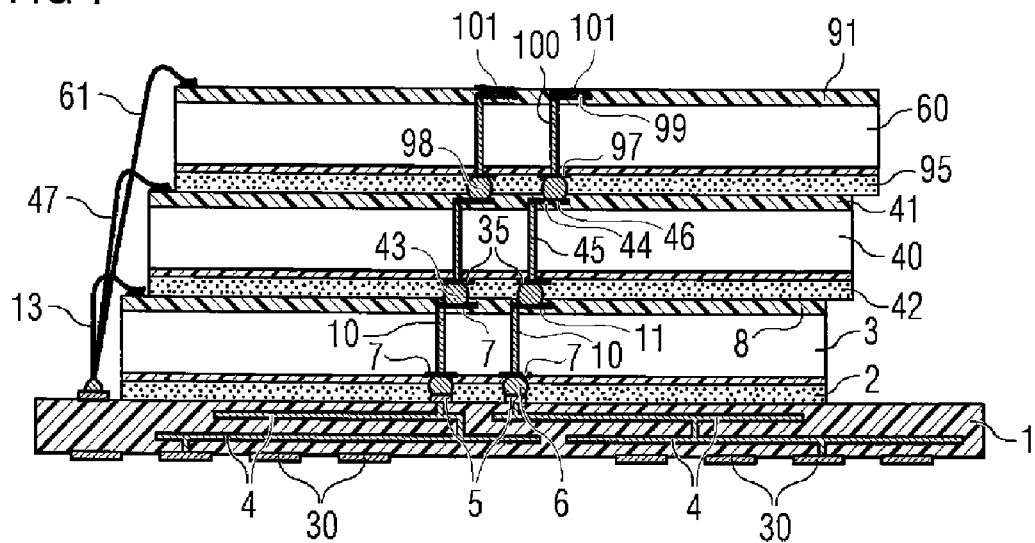
FIG. 7 illustrates a further embodiment with three stacked chips.

FIG. 7 illustrates a further embodiment of an arrangement with the first, the second and the third stacked chip 3, 40, 60, whereby the first chip 3 is arranged on the substrate 1. In this embodiment, the respective connecting layer 8, 41, 91 is arranged on an upper face of the respective chip 3, 40, 60 and the connecting lines of the connecting layer are arranged on an upper side of the respective chip 3, 40, 60. This embodiment can also be used in arrangements with less or more than three stacked chips. The three chips may be identical chips or differ from each other in one or more technical features. In one embodiment, the four chips may be embodied as the first chip 3 of FIG. 1.

Depending on the used embodiment the connecting layer with the respective connecting lines may be arranged on an upper or on a lower side of the respective chip.

Figure 8:
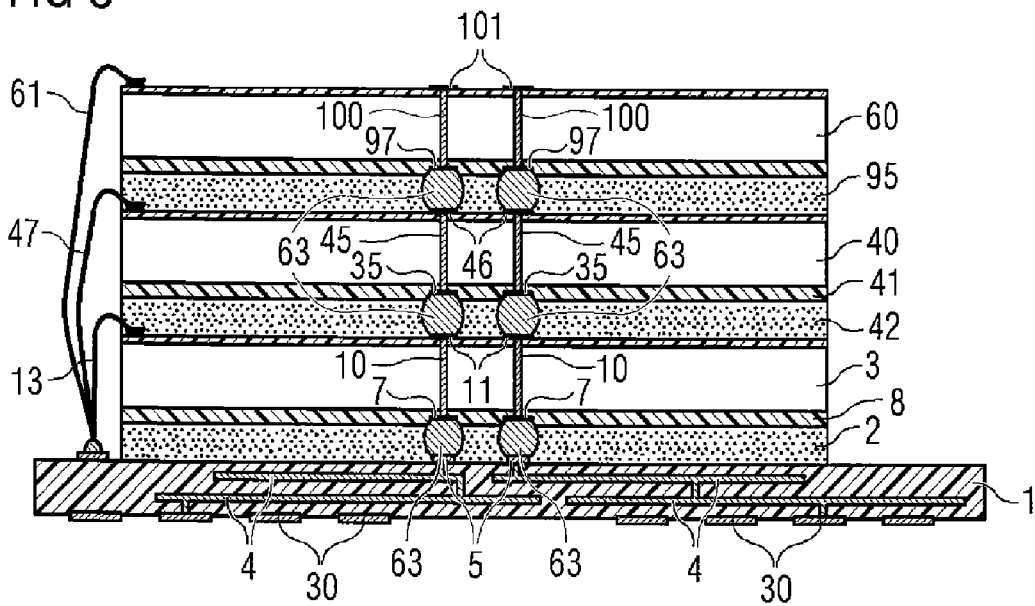
FIG. 8 illustrates another embodiment with four stacked chips.

FIG. 8 illustrates a further embodiment of the arrangement with three stacked chips 3, 40, 60 whereby the first chip 3 is arranged on a substrate 1, the second chip 40 is arranged on the first chip 3 and the third chip 60 is arranged on the second chip 40. The structure and the design of the chips may be the same as discussed in FIGS. 1 to 7, whereby instead or additional of providing a connecting layer 8, 41, 91 with connecting lines, the chips 3, 40, 60 are arranged symmetrically, whereby the via connecting elements of the chips are arranged in one line. This allows for use of large further solder balls 63 to electrically connect the contact pads of a lower chip with the contact pads of an upper chip.

In this embodiment the first contact pads 5 of the substrate 1 are in direct contact to the further solder balls 63. The further solder balls 63 of the first substrate 1 are also in direct contact to the first back side pads 7 of the first chip 3. The first back side pads 7 may be arranged on top of the first contact pads 5. Depending on the used embodiment, between the substrate 1 and the first chip 3 also smaller solder balls may be disposed. The first chip 3 includes on the lower side a connecting layer 8, whereby the first wire connecting elements 10 of the first chip 3 are directly connected to the first back side pads 7 without providing a lateral guided connecting line. The wire connecting elements 10 are arranged in a vertical direction as a straight vertical connecting line. The first front side pads 11 of the first chip 3 are in direct contact with further solder balls 63. The first chip 3 and the substrate 1 are connected by a fixing layer 2, in which the further solder balls 63 are embedded. The second chip 40 and the first chip 3 are fixed by a second fixing layer 42, in which further solder balls 63 are embedded. The second chip 40 includes second wire connecting elements 45 that are in direct contact with second back side pads 35 that are disposed on the lower side of the second chip 40.

The second back side pads 35 are in direct contact with the dedicated further solder balls 63. The second wire connecting elements 45 are formed as straight connecting lines. The second back side pads 35 may be embedded in the second connecting layer 41. The second front side pads 46 of the second chip 40 are in direct contact with dedicated solder balls 63.

Between the second chip 40 and the third chip 60 a third fixing layer 95 is provided in which the further solder balls 63 are embedded. The third chip 60 includes third wire connecting elements 100 that are in direct contact with third back side pads 97 that are arranged on a lower side of the third chip 60. The third back side pads 97 are in direct contact with the solder balls 63. The third back side pads 97 may be disposed in a third connecting layer 96 that is arranged on a lower side of the third chip 60.

The third wire connecting elements 100 are electrically connected with third front side pads 101 that are disposed on an upper side of the third chip 60. The distance between the upper face of the first chip 3 and the lower face of the second chip 40 and the distance between the upper face of the second chip 40 and the lower face of the third chip 60 is relatively large, because of the large further solder balls 63 providing enough space for guiding the bonding wires 13, 47, 61 to the respective wire contact pad of the respective chip.

The first bonding wire 13 is guided from the first wire contact pad 12 of the substrate 1 to the fifth wire contact pad 18 that is disposed on the upper face of the first chip 3 (FIG. 2). The second bonding wire 47 is connected with the second wire contact pad 15 of the substrate 1 and the ninth wire contact pad 48 that is disposed on the upper face of the second chip 14 (FIG. 4). The third bonding wire 61 is electrically connected with the third wire contact pad 16 of the substrate 1 and the thirteenth wire contact pad 90 that is disposed on the upper face of third chip 60 (FIG. 6). In this embodiment three wire connecting elements of the first, the second and the third chip 3, 40, 60 are arranged in vertical straight lines.

By using large further solder balls 63, a larger distance in height is provided between two adjacent chips. As a result, the bonding wires can be guided from the substrate 1 via a fixing layer that is arranged between two chips to the respective contact pad of the respective chip. As a result, it is possible to align the stacked chips with a side face neighbored to the contact pads in one plane. The bonding wires are at least partially arranged in the fixing layer. The solder balls 6, 43, 98 and the further solder balls 63 may be embodied as solder bumps, copper pillar bumps or gold stud bumps.

The solder balls and the further solder balls represent connections between the front side and back side pads.

Figure 9:
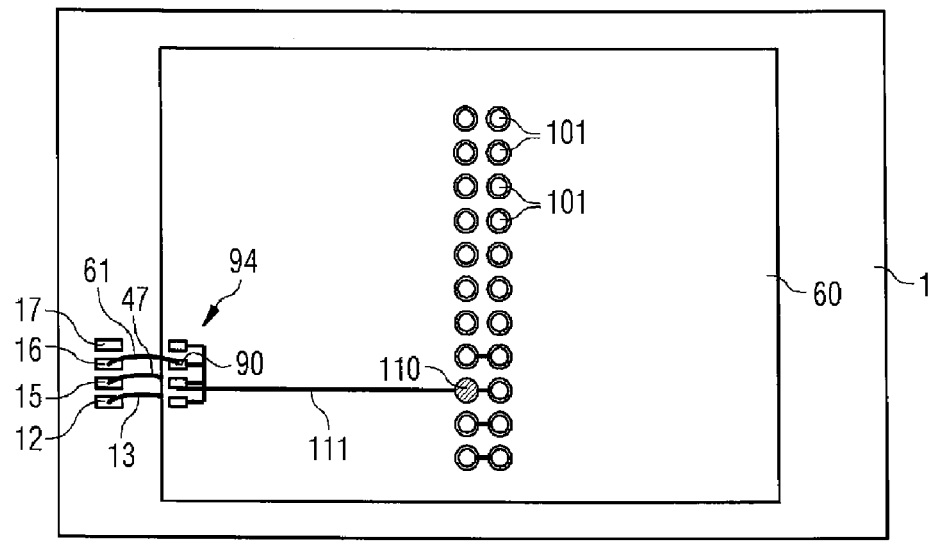
FIG. 9 illustrates a top view of the embodiment of FIG. 8.

FIG. 9 illustrates a top view on the arrangement of FIG. 8. Each of the three chips 3, 40, 60 includes two rows of via connecting elements with respective back side pads and front side contact pads. Furthermore, each of the four chips may includes the same design of wire contact pads and the same design of front side and back side pads.

The first, the second, the third back side pads and the first, the second and the third front side pads may be identical and embodied as electrically conducting layers made of electrically conducting material. The back side pads and the front side pads may have the same shape and may be made of the same material. For example, the back side pad and/or the front side pad and/or the contact pads may include copper and/or aluminum.

Figure 10:
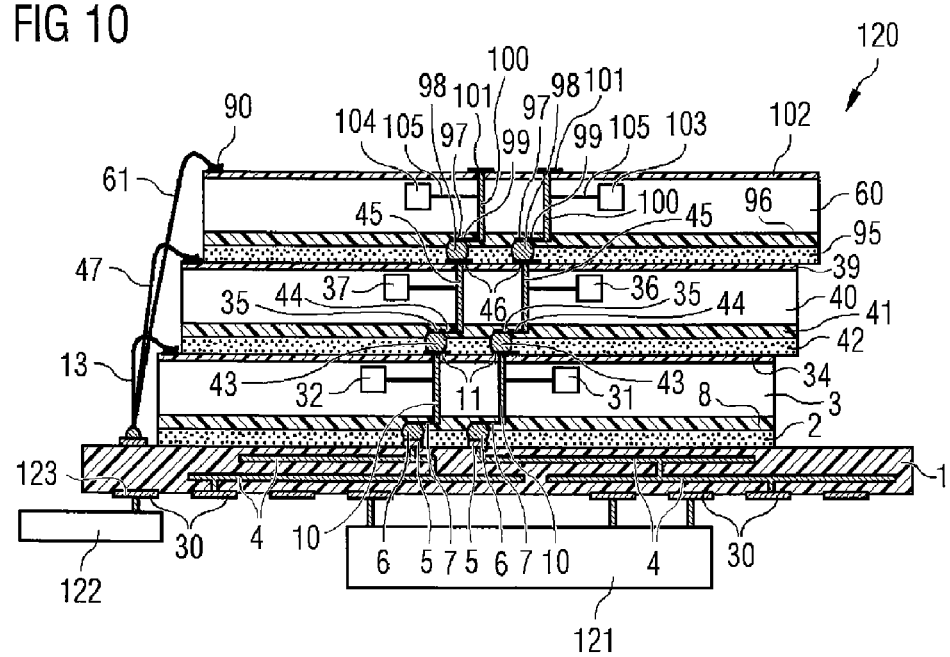
FIG. 10 illustrates a data and/or signal processing unit.

FIG. 10 illustrates a data and/or signal processing system 120 with an input/output circuit 121 that is connected with an arrangement of three stacked chips 3, 40, 60. The chips 3, 40, 60 may be memory chips with memory cells for storing data. The chips may be processor chips for processing data. The chips may be controlling chips that control the function of a memory chip. The chips may also be ASIC chips for processing data. The chips may also include calculating circuits or sensing circuits with sensor elements. The data and/or signal processing circuit may include a first chip 3 embodied as a memory chip, for example a DRAM, SRAM or Flash memory, a second chip 40 as a controlling chip that controls the function of the first chip 3 and a third chip 60 that is also embodied as a memory chip and that is also controlled by the second chip 40.

In a further embodiment the arrangement is a signal processing unit, whereby the chips include sensor elements for sensing a physical or chemical parameter and that includes an electrical circuit for processing the sensed parameter. The sensed parameter may be delivered to the input/output circuit 121.

In another embodiment the three chips may only be embodied as memory chips that exchange data signals with the input/output circuit 121.

The chips of FIG. 10 are the same as the chips of FIGS. 5 and 6 and are connected in the same manner.

The input/output circuit is connected with contact fields for exchanging signals. Furthermore, a voltage supply circuit may be provided that is connected with a voltage pad 123 of the substrate 1. The voltage pad 123 is connected with the first contact area 85 delivering supply voltage for the chips 3, 40, 60.

Depending on the used embodiment, there may be more than one bonding wire 13, 47, 61 per chip that connect one chip 3, 40, 60 to the substrate 1.

Figure 11:
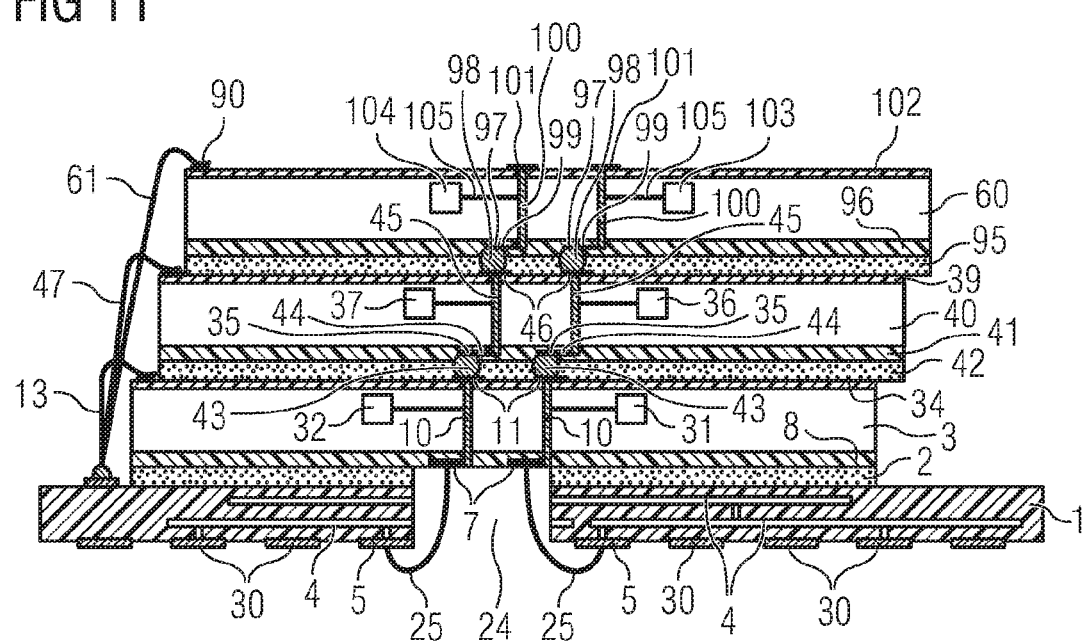
FIG. 11 illustrates a further embodiment of stacked chips.

FIG. 11 illustrates a further embodiment of a stacked arrangement which has a similar structure as the stacked arrangement of FIG. 5, whereby, however, in contrast to FIG. 5 the substrate 1 includes an opening 24 which is arranged below the first back side pad s/7 of the first chip 3. Furthermore, the substrate 1 includes first contact pads 5 which are arranged on the lower side of the first substrate 1. Instead of the first solder balls 6, as in the embodiment of FIG. 5, further bonding wire 25 are used for electrically connecting the first back side pads 7 to the first contact pads 5 of the substrate 1. The further bonding wires 25 are connected with one end to the first back side pads 7 and with the other end to the first contact pad 5 which is arranged on the lower side of the substrate 1. Thus, it is possible to electrically connect the substrate 1 to the first wire connecting elements 10 of the first chip 3 by a further bonding wire 25. The first back side pads 7 are electrically connected to respective first wire connecting elements 10. The first contact pads 5 which are disposed on the lower side of the substrate 1 are electrically connected to conductive lines 4 which are arranged on or in the substrate 1.

In any embodiment illustrated in FIGS. 1 to 11, the first bonding wire 13 and/or the second bonding wire 47 and/or the third bonding wire 61 may be used for delivering a selective signal, for example a chip select signal to the first, the second and/or the third chip 3, 40, 60 in order to select the respective chip for addressing the selected chip. A chip may be selected and addressed if a control signal and/or an address signal for addressing a determined memory cell or at least a determined number of memory cells for writing data into the addressed memory cells and/or for reading data from the addressed memory cells.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a substrate;
a first chip, a lower surface of the first chip being disposed adjacent to an upper face of the substrate;
a second chip, a lower surface of the second chip being disposed adjacent to an upper surface of the first chip;
a connecting layer comprising a connecting line, the connecting layer being arranged between the first and the second chips;
a first chip wire contact pad that is arranged on an uncovered portion of the upper surface of the first chip;
a first bonding wire that is connected with a first substrate wire contact pad and the first chip wire contact pad;
a first substrate contact pad that is arranged on the upper surface of the substrate and is connected with a first via connecting element of the first chip;
wherein the first via connecting element extends from the lower surface to the upper surface of the first chip;
the first via connecting element is connected with a second via connecting element of the second chip, the second via connecting element extending from the lower surface to the upper surface of the second chip; and
the connecting line is adapted to connect the second via connecting element with the first via connecting element.

2. The integrated circuit of claim 1, further comprising:
a first back side pad arranged on the lower surface of the first chip, the first back side and the first contact pad being in contact;
wherein the first back side pad is connected with the first via connecting element of the first chip.

3. The integrated circuit of claim 1,
wherein the connecting line is arranged in a lateral direction in the connecting layer.

4. An integrated circuit comprising:
a substrate;
a first chip, a lower surface of the first chip being disposed adjacent to an upper surface of the substrate;
a second chip, a lower surface of the second chip being disposed adjacent to an upper surface of the first chip;
a first chip wire contact pad that is arranged on an uncovered portion of the upper surface of the first chip;
a first bonding wire that is connected with a first substrate wire contact pad and the first chip wire contact pad;
a first substrate contact pad that is arranged on the upper surface of the substrate and is connected with a first via connecting element of the first chip,
a first contact area disposed on the tipper surface of the first chip, the first contact area comprising contact pads; and
a second contact area disposed on the upper surface of the second chip, the second contact area comprising contact pads;
wherein the first via connecting element extends from the lower surface to the upper surface of the first chip; and
the first and the second contact area are identical.

5. The integrated circuit of claim 4,
wherein the contact pads of the first contact area are electrically connected; and
the first contact area is connected with a further contact that is disposed on the upper surface of the first chip.

6. The integrated circuit of claim 4,
wherein the contact pads of the second contact area are electrically connected; and
the second contact area is connected with a further contact that is disposed on the upper surface of the second chip.

7. The integrated circuit of claim 4,
wherein the first contact area and the second contact area are arranged at an identical lateral position referred to a side edge of the first or respectively the second chip.

8. A memory module comprising:
a first chip, a lower surface of the first chip being disposed adjacent to an upper surface of a substrate;
a second chip, a lower surface of the second chip being disposed adjacent to an upper surface of the first chip;
a first chip wire contact pad that is arranged on an uncovered area of the upper surface of the first chip;
a first bonding wire that is connected with a first substrate wire contact pad and the first chip wire contact pad of the first chip;
a first contact pad that is arranged on the upper surface of the substrate the first contact pad being connected with a first via connecting element of the first chip,
the first via connecting element extending from the lower surface to the upper surface of the first chip;
wherein the first via connecting element is connected with a second via connecting element of the second chip; and
the second via connecting element extends from the lower face to the upper surface of the second chip.

9. A data processing system comprising:
an input/output circuit; and
a memory module comprising;
a first chip, a lower surface of the first chip being disposed adjacent to an upper surface of a substrate;
a second chip, a lower surface of the second chip being disposed adjacent to an upper surface of the first chip;
a first chip wire contact pad that is arranged on an uncovered area of the upper surface of the first chip;
a first bonding wire that is connected with a first substrate wire contact pad and the first chip wire contact pad of the first chip;
a first contact pad that is arranged on the upper surface of the substrate the first contact pad being connected with a first via connecting element of the first chip, the first via connecting element extending from the lower surface to the upper surface of the first chip, wherein
the first via connecting element is connected with a second via connecting element of the second chip;
the second via connecting element extends from the lower surface to the upper surface of the second chip; and
the input/output circuit is connected with the memory module.

10. An integrated circuit comprising:

a substrate;

a first chip, a lower surface of the first chip being disposed adjacent to an upper surface of the substrate;

a second chip, a lower surface of the second chip being disposed adjacent to an upper surface of the first chip;

a first chip wire contact pad disposed on an uncovered area of the upper surface of the first chip;

a first bonding wire connected with a substrate wire contact pad and the first chip wire contact pad;

a first contact pad that is arranged on the upper surface of the substrate and connected with a first via connecting element of the first chip; and means for providing a first via connecting element that extends from the lower surface to the upper surface of the first chip.

* * * * *